(12) United States Patent
Linam

(10) Patent No.: US 7,005,886 B2
(45) Date of Patent: Feb. 28, 2006

(54) TRISTATEABLE CMOS DRIVER WITH CONTROLLED SLEW RATE FOR INTEGRATED CIRCUIT I/O PADS

(75) Inventor: David Lawrence Linam, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 106 days.

(21) Appl. No.: 10/836,175

(22) Filed: Apr. 30, 2004

(65) Prior Publication Data

US 2005/0242831 A1    Nov. 3, 2005

(51) Int. Cl.
*H03K 17/16* (2006.01)
*H03K 19/003* (2006.01)

(52) U.S. Cl. .............................. 326/30; 326/87; 327/112
(58) Field of Classification Search .................. 326/30, 326/87; 327/112, 170
See application file for complete search history.

(56) References Cited

U.S. PATENT DOCUMENTS

| | | | |
|---|---|---|---|
| 5,717,342 A | 2/1998 | Lotfi et al. | |
| 5,977,790 A * | 11/1999 | Sanwo et al. | .................. 326/27 |
| 6,043,682 A | 3/2000 | Dabral et al. | |
| 6,118,310 A | 9/2000 | Esch, Jr. | |
| 6,198,635 B1 | 3/2001 | Shenoy et al. | |
| 6,326,802 B1 | 12/2001 | Newman et al. | |
| 6,400,771 B1 | 6/2002 | Humphrey | |
| 6,448,807 B1 * | 9/2002 | Ahsanullah | .................. 326/30 |
| 6,509,757 B1 | 1/2003 | Humphrey | |
| 6,522,185 B1 | 2/2003 | Helt et al. | |
| 6,586,974 B1 | 7/2003 | Humphrey et al. | |
| 6,664,805 B1 | 12/2003 | Gonzalez | |
| 6,683,482 B1 | 1/2004 | Humphrey et al. | |
| 6,710,617 B1 | 3/2004 | Humphrey | |

OTHER PUBLICATIONS

Shin et al., "A Slew-Rate Controlled Output Driver Using PLL as Compensation Circuit", IEEE Journal of Solid-State Circuits, vol. 38, No. 7, pp. 1227-1233 (Jul. 2003).

* cited by examiner

Primary Examiner—Daniel Chang

(57) ABSTRACT

A novel output driver for an integrated circuit, and method for controlling the slew rate of output signals driven by the output driver, is presented. The output driver employs a delayed activation of a succession of weak impedance zip legs followed by a preferably delayed activation of a succession of strong impedance drive legs. During a transition of an output signal on an output node of the driver from a first drive state to a second drive state, each zip leg, in its turn, turns off driving the output node to the first drive state and then turns on driving the output node to the second drive state. Once all zip legs have been activated, the activation of the succession of strong drive legs supplements the combined current provided by the zip legs to provide the full required drive current of the driver driving the output node to the second drive state.

17 Claims, 5 Drawing Sheets

TRISTATEABLE CMOS DRIVER WITH CONTROLLED SLEW RATE FOR INTEGRATED CIRCUIT I/O PADS

BACKGROUND OF THE INVENTION

The present invention pertains generally to slew rate control of signal drivers in integrated circuits, and more particularly to a novel tristateable output driver with controllable slew rate for integrated circuit input/output pads.

Integrated circuits are commonly packaged as chips. An integrated circuit communicates with devices external to the chip via input and output signal pads. Inside the chip, the signal pads are connected to signal receiver and signal driver circuitry, as appropriate, to receive incoming signals or to drive outgoing signals.

The signal pads on a chip are connected to the packaging of the chip (e.g., a pin, wire bond, solder ball, etc.) which is then typically connected to respective signal traces on a printed circuit board. The signal traces may connect the chip to other integrated circuit chips, electronic devices, or connectors on the printed circuit board that connect to external (i.e., off-board) devices.

In some integrated circuit applications, it is desirable to reduce the slew rate (i.e., the rise and fall times) of output signals. For example, some applications require reduced electro-magnetic interference (EMI). It is well known in the art that EMI emitted by a signal is related to its change in voltage with respect to time, whereby faster signal rise and fall times result in increased EMI. In applications that require low EMI, one obvious solution is to shield the output signals; however, shielded components (e.g., shielded boards, cables, connectors) add to the cost of the hardware. Another solution, as provided by the output driver of the present invention, is to reduce the slew rate on the edges of the signal transitions in order to directly reduce the actual EMI generated by the signal transition, and therefore eliminate or reduce the need for shielding.

In other or the same applications, it is desirable to reduce the noise on the power supplies. Fast signal transitions result in current spikes on the power supplies, resulting in greater supply noise. Conversely, by reducing the slew rate of the signal, causing it to transition over a longer of period of time, the magnitude of the current spikes, and therefore the noise, on the power supplies is reduced.

In other or the same applications, where the electrical length of the signal traces or busses are long compared to the signal rise/fall times, the traces/busses begin to assume transmission line characteristics (including parasitic resistance, capacitance, and inductance), and require impedance matching in order to avoid signal reflections. However, if the signal rise/fall time is long compared to the electrical length of the transmission line, such that the signal reflections are received at the source while the signal is still rising/falling, then the effects of the signal reflections are only minimal and essentially negated (since the voltage value of the reflections received at the source are relatively close in value to the voltage being driven by the source when the reflections reach the source). In order to lengthen the signal rise/fall time relative to the length of the transmission line, slew rate control of the signal driven by the output driver is necessary.

SUMMARY OF THE INVENTION

The present invention is a novel output driver for an integrated circuit, and method for controlling the slew rate of output signals driven by the output driver. The invention employs a delayed activation of a succession of weak (i.e., characterized by a relatively smaller drive current) zip legs followed by a preferably delayed activation of a succession of strong (i.e., characterized by a relatively larger drive current) drive legs. During a transition of an output signal on an output node of the driver from a first drive state to a second drive state, each zip leg, in its turn, turns off driving the output node to the first drive state and then turns on driving the output node to the second drive state. Once all zip legs have been activated, the activation of the succession of strong drive legs supplements the combined current provided by the zip legs to provide the full required drive current of the driver driving the output node to the second drive state. The output driver is preferably tristateable. Furthermore, the amount of delay between successive activation of zip legs, and within the zip legs, between turning off the circuit of the respective zip leg pulling the output node to the first drive state and turning on the circuit of the respective zip leg pulling the output node to the second drive state, is preferably adjustable.

In a preferred embodiment of the output driver of the invention, the output driver includes one or more sequentially ordered zip legs and one or more sequentially ordered drive legs. The zip legs preferably are characterized by a small drive current relative to the drive current of the drive legs. Each zip leg includes a zip pull-up circuit and a zip pull-down circuit. The zip pull-up circuit receives both a first zip drive signal and a second zip drive signal, and switchably electrically connects the output node of the output driver to a first voltage source when both the first zip drive signal and the second zip drive signal are in a first voltage state, and electrically isolates the output node of the output driver from the first voltage source when one or both of the first zip drive signal and the second zip drive signal are in a second voltage state. The zip pull-down circuit receives both the first zip drive signal and the second zip drive signal, and switchably electrically connects the output node of the output driver to the second voltage source when both the first zip drive signal and the second zip drive signal are in the second voltage state, and electrically isolates the output node of the output driver from the second voltage source when one or both of the first zip drive signal and the second zip drive signal are in the first voltage state.

During a transition of the output signal from a first drive state to a second drive state, the output driver performs a sequentially delayed activation of each of the zip legs. Within each zip leg activation, the pull-up circuit or pull-down circuit driving the output node to the first drive state is first disabled prior to enabling the opposite one of the pull-up circuit or pull-down circuit to drive the output node to the second drive state.

When all of the zip legs are activated to drive the output node to the second drive state, the output driver performs a (preferably, sequentially delayed) activation of each of the drive legs to enable the appropriate one of the drive pull-up circuit or drive pull-down circuit to electrically connect the output node to the appropriate one of the first or second voltage source that reflects the second drive state and to electrically isolate the output node from the first or second voltage source that reflects the first drive state.

In effect, the output driver of the invention controls the slope of a transitioning signal on the output node of output driver using stepwise voltage division/impedance reduction and augmentation. The invention allows precise control over the slew rate of the signal, which thereby allows precision shaping and timing of both the rising and falling transitions of the output signal.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel controlled-voltage output driver circuit for an integrated circuit and method for controlling the same is described in detail hereinafter. Although the invention is described in terms of specific illustrative embodiments, it is to be understood that the illustrative embodiments are shown by way of example only and that the scope of the invention is not intended to be limited thereby.

Figure 1:
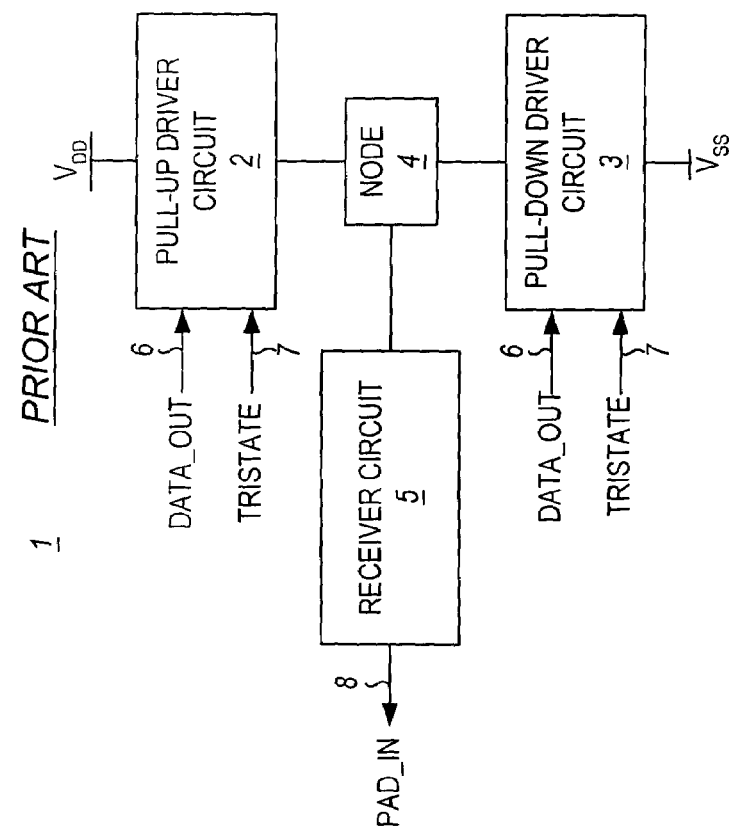
FIG. 1 is a block diagram of a prior art output driver for an integrated circuit.

Turning now to FIG. 1, there is shown a block diagram illustrating a conventional output driver circuit 1. As shown, the driver circuit 1 includes a pull-up circuit 2, a pull-down circuit 3, and an output node 4. The pull-up circuit 2 and pull-down circuit 3 each receive a data signal DATA_OUT 6 that is representative of an output signal to be driven onto the output node 4 and a tristate signal TRISTATE 7 that is representative of the mode of the output driver 1. When the tristate signal TRISTATE 7 is asserted, the output driver 1 is in a tristate mode, and both the pull-up circuit 2 and the pull-down circuit 3 are electrically isolated from the output node 4. When the tristate signal TRISTATE 7 is deasserted, the output driver 1 is in a drive mode, and one or the other of the pull-up circuit 2 or pull-down circuit 3 drives the voltage level of the output node 4 to reflect the state of the data signal DATA_OUT 6. For example, assuming a positive-true logic scheme (where a first voltage level (e.g., $V_{SS}$ or ground) represents a deasserted, or logic "0", value, and a second voltage level (e.g., $V_{DD}$) represents an asserted, or logic "1", value) and that the tristate signal TRISTATE 7 is not asserted, when the data signal DATA_OUT 6 has a logic "0" value, pull-down circuit 3 operates to pull the voltage on output node 4 to the first voltage level, and when the data signal DATA_OUT 6 has a logic "1" value, pull-up circuit 2 operates to pull the voltage on output node 4 to the second voltage level.

The node 4 may be configured as an output node only, in which case it would not be coupled to a receiver circuit. Alternatively, the node 4 may be configured as an input/output (I/O) node that allows input of signals as well as output of signals. If the node 4 is configured as an I/O pad, the node 4 will be coupled to a receiver circuit 5 which monitors the state of the voltage on the node 4 to generate an input signal PAD_IN 8.

Figure 2:
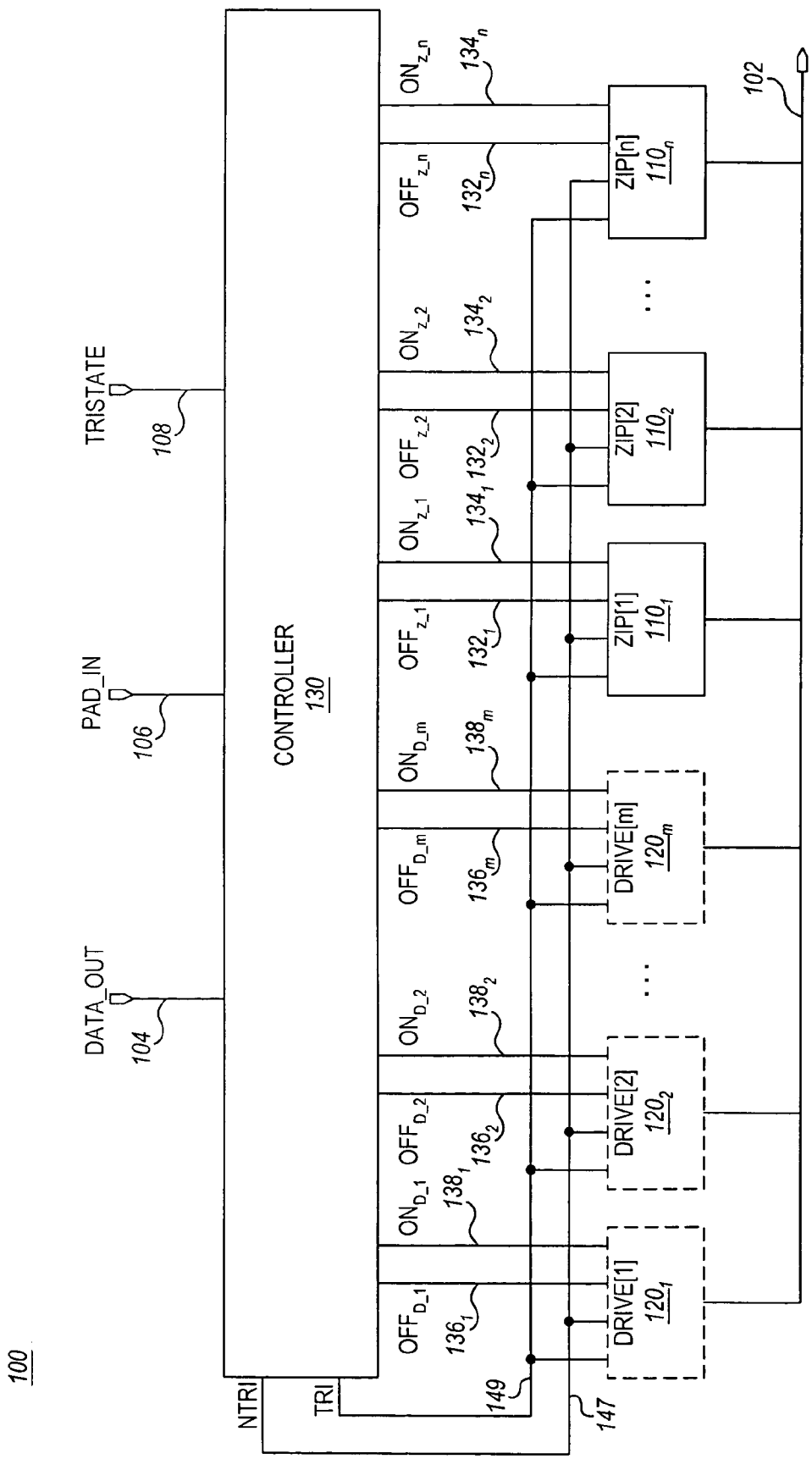
FIG. 2 is a schematic block diagram of an exemplary embodiment of an output driver implemented in accordance with the invention.

FIG. 2 is a schematic block diagram of an exemplary embodiment of an output driver 100 implemented in accordance with the invention. As illustrated in FIG. 2, the output driver 100 includes a plurality of zip legs $110_1, 110_2, \ldots, 110_n$, and a plurality of drive legs $120_1, 120_2, \ldots, 120_m$, each coupled to an output node 102, and a controller 130. The output node 102 may be coupled to an integrated circuit output terminal such as an output or input/output pad or pin, or alternatively may be coupled to another node internal to the integrated circuit. The controller 130 is responsive to a data output signal DATA_OUT 104 and generates a plurality of zip leg control signals $132_1, 132_2, \ldots, 132_n, 134_1, 134_2, \ldots, 134_n$ and drive leg control signals $136_1, 136_2, \ldots, 136_n, 138_1, 138_2, \ldots, 138_n$, which, together with the tristate signal TRISTATE 108, control the timing and mode of connection of the respective legs to the output node 102.

Figure 3:
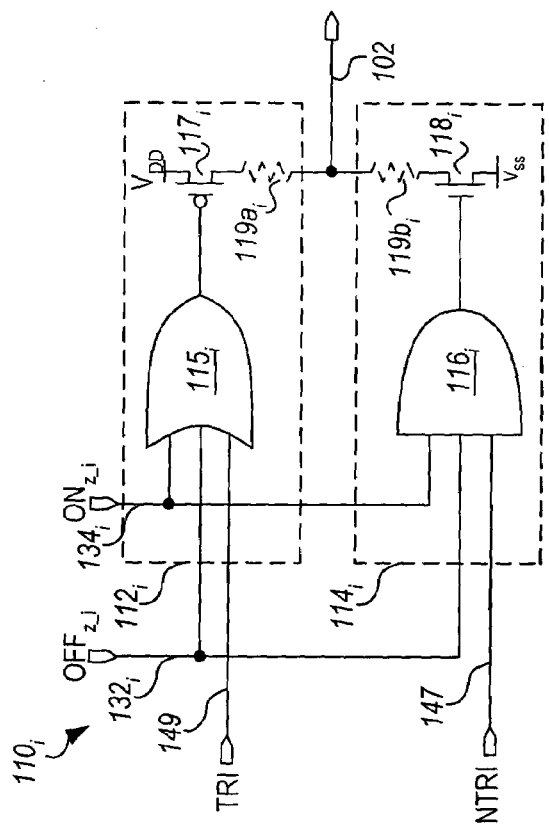
FIG. 3 is a schematic diagram of a representative zip leg implemented in accordance with the invention.

FIG. 3 is a schematic block diagram of a representative one $110_i$ of the zip legs $110_1, 110_2, \ldots, 110_n$ of FIG. 2. Each component in the representative zip leg $110_i$ corresponds to a like component of each of zip legs $110_1, 110_2, \ldots, 110_n$, and is distinguished by a subscript i, where i=1, 2, ..., n, indicating the respective zip leg $110_1, 110_2, \ldots, 110_n$ to which it belongs. As illustrated by the representative zip leg $110_i$, each zip leg $110_1, 110_2, \ldots, 110_n$ includes a pull-up circuit $112_i$ comprising an OR gate $115_i$ and a pull-up device $117_i$, and a pull-down circuit $114_i$ comprising an AND gate $116_i$ and a pull-down device $118_i$.

In the pull-up circuit $112_i$, the OR gate $115_i$ receives as input a tristate signal 149 tri that reflects the state of a tristate signal TRISTATE 108, a zip leg "off" signal $OFF_{z\_i}$ $132_i$ and a zip leg "on" signal $ON_{z\_i}$ $134_i$. The output of the OR gate $115_i$ controls activation of the pull-up device $117_i$. In the illustrative embodiment, the pull-up device 117 is implemented with a CMOS P-Channel Field Effect Transistor (PFET) having a source coupled to a high voltage source $V_{DD}$, a gate coupled to the output of the OR gate $115_i$, and a drain coupled to the output node 102 (optionally via a series resistor $119a_j$).

In the pull-down circuit $114_i$, the AND gate $116_i$ receives as input a complementary tristate signal 147 ntri that reflects the complementary state of the tristate signal TRISTATE 108, the zip leg "off" signal $OFF_{z\_i}$ $132_i$ and the zip leg "on" signal $ON_{z\_i}$ $134_i$. The output of the AND gate $116_i$ controls activation of the pull-down device $118_i$. In the illustrative embodiment, the pull-down device $118_i$ is implemented with a CMOS N-Channel Field Effect Transistor (NFET) having a source coupled to a low voltage source (ground), a gate coupled to the output of the AND gate $116_i$, and a drain coupled to the output node 102 (optionally via a series resistor $119b_j$).

Figure 4:
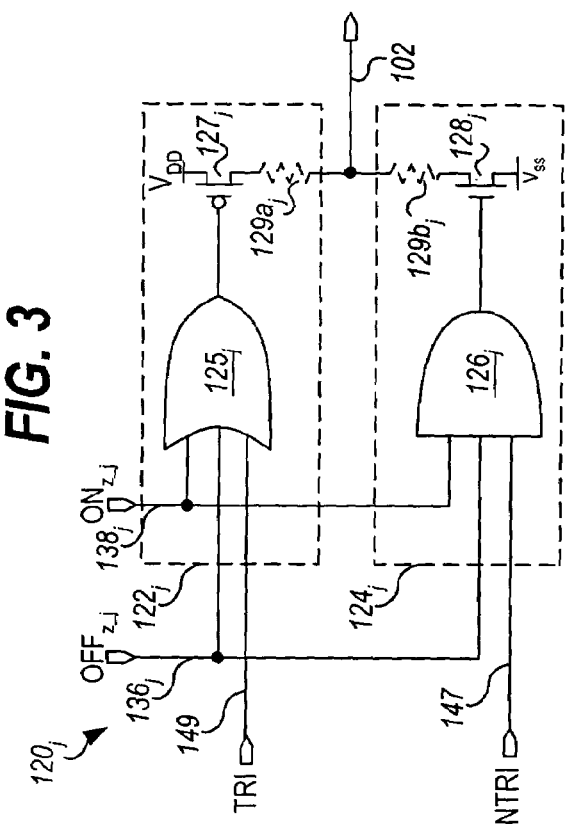
FIG. 4 is a schematic diagram of a representative drive leg implemented in accordance with the invention.

FIG. 4 is a schematic block diagram of a representative one $120_j$ of the drive legs $120_1, 120_2, \ldots, 120_m$ of FIG. 2. Each component in the representative drive leg $120_j$ corresponds to a like component of each of drive leg $120_1, 120_2, \ldots, 120_m$, and is distinguished by a subscript j, where j=1, 2, ..., m, indicating the respective drive leg $120_1, 120_2, \ldots, 120_m$ to which it belongs. As illustrated by the representative drive leg $120_j$, each drive leg $120_1, 120_2, \ldots, 120_m$ includes a pull-up circuit $122_j$ comprising an OR gate $125_j$ and a pull-up device $127_j$, and a pull-down circuit $124_j$ comprising an AND gate $126_j$ and a pull-down device $128_j$.

In the pull-up circuit $122_j$, the OR gate $125_j$ receives as input a tristate signal 149 tri that reflects the state of a tristate signal TRISTATE 108, a drive leg "off" signal $OFF_{D\_j}$ $136_j$ and a drive leg "on" signal $ON_{D\_j}$ $138_j$. The output of the OR gate $125_j$ controls activation of the pull-up device $127_j$. In the illustrative embodiment, the pull-up device 127 is implemented with a CMOS P-Channel Field Effect Transistor (PFET) having a source coupled to a high voltage source $V_{DD}$, a gate coupled to the output of the OR gate $125_j$, and a drain coupled to the output node 102 (optionally via a series resistor $129a_j$).

In the pull-down circuit $124_j$, the AND gate $126_j$ receives as input a complementary tristate signal 147 ntri that reflects the complementary state of the tristate signal TRISTATE 108, the drive leg "off" signal $OFF_{D\_j}$ $136_j$ and the drive leg "on" signal $ON_{D\_j}$ $138_j$. The output of the AND gate $126_j$ controls activation of the pull-down device $128_j$. In the illustrative embodiment, the pull-down device $128_j$ is implemented with a CMOS N-Channel Field Effect Transistor (NFET) having a source coupled to a low voltage source (ground), a gate coupled to the output of the AND gate $126_j$ and a drain coupled to the output node 102 (optionally via a series resistor $129b_j$).

Figure 5:
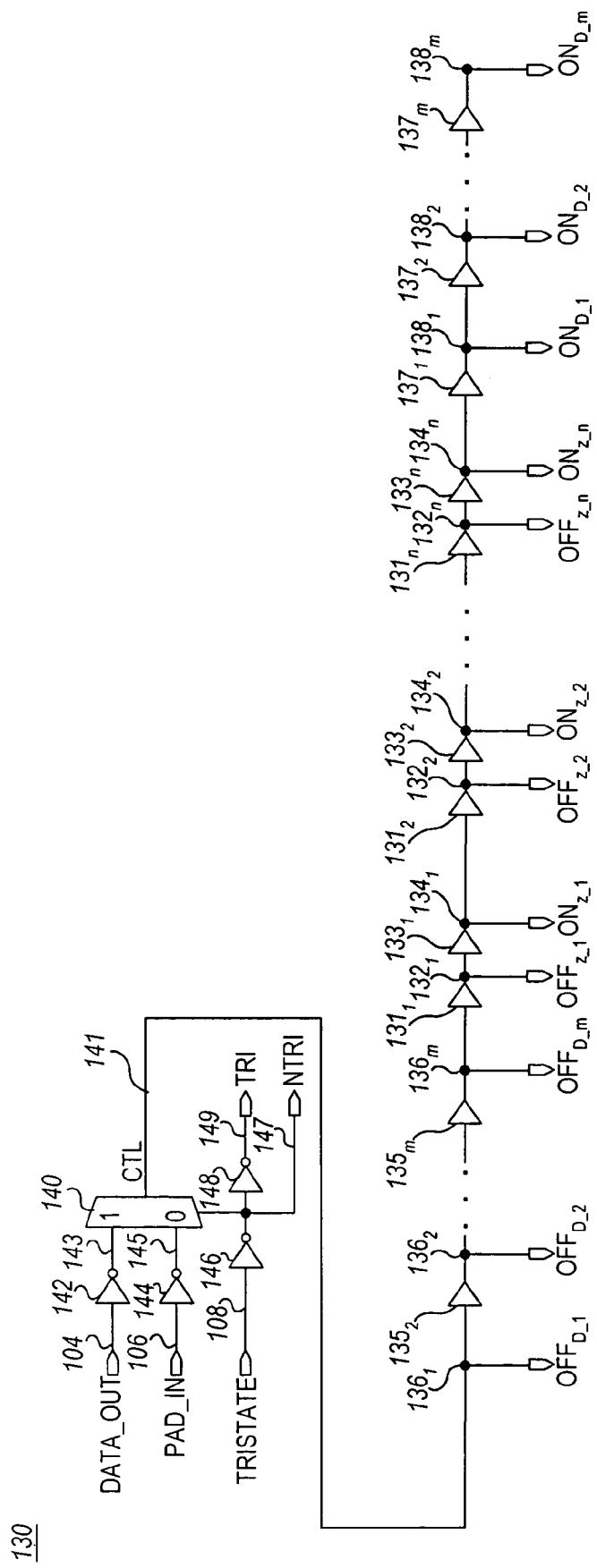
FIG. 5 is a schematic diagram of an exemplary embodiment of a controller implemented in accordance with the invention.

FIG. 5 is a schematic block diagram of an exemplary embodiment of a circuit implementing the controller 130 of FIG. 2. Controller 130 receives the data signal DATA_OUT 104, a pad input signal PAD_IN 106, and the tristate signal TRISTATE 108. Controller 130 includes a multiplexer 140, inverter 142, inverter 144, inverter 146, inverter 148, and a plurality of delay buffers $135_2$, $135_m$, $131_1$, $131_2$, $131_n$, $133_1$, $133_2$, $133_n$, $137_1$, $137_2$, $137_m$.

Inverter 142 receives a data signal DATA_OUT 104 that is representative of the drive state to be driven onto the output node 102 and generates an inverted version 143 of the data signal DATA_OUT 104. Inverter 144 receives the pad input signal PAD_IN 106, for reasons discussed hereinafter, and generates an inverted version 145 of the pad input signal PAD_IN 106. Inverter 146 receives the tristate signal TRISTATE 108, that is representative of the mode of the output driver and generates signal ntri 147 that is an inverted version of the tristate signal TRISTATE 108. Inverter 148 receives the signal ntri 147 and generates signal tri 149 that is representative of the state of the tristate signal TRISTATE 108. The signal ntri 147 is used to select one or the other of the signals 143 and 145 for output from the multiplexer 140 as a control signal CTL 141.

The delay buffers $135_2$, $135_m$, $131_1$, $133_1$, $131_2$, $133_2$, $131_n$, $133_n$, $137_1$, $137_2$, $137_m$ are arranged and connected, output to input, in series. The control signal CTL 141 is output as drive leg "off" signal $OFF_{D\_1}$ $136_1$. The control signal CTL 141 is also input to a first drive leg delay buffer $135_2$, which generates drive leg "off" signal $OFF_{D\_2}$ $136_2$, a delayed version of drive leg "off" signal $OFF_{D\_1}$ $136_1$. Drive leg "off" signal $OFF_{D\_2}$ $136_2$ is input to a next first drive leg delay buffer $135_3$, which generates drive leg "off" signal $OFF_{D\_3}$ $136_3$, and so on until m drive leg "off" signals $OFF_{D\_1}$ $136_1$, $OFF_{D\_2}$ $136_2$, ..., $OFF_{D\_m}$ $136_m$, are generated.

Drive leg "off" signal $OFF_{D\_m}$ $136_m$ is input to a first zip leg delay buffer $131_1$, which generates zip leg "off" signal $OFF_{z\_1}$ $132_1$. Zip leg "off" signal $OFF_{z\_1}$ $132_1$ is input to a second zip leg delay buffer $133_1$, which generates zip leg "on" signal $ON_{z\_1}$ $134_1$. Zip leg "on" signal $ON_{z\_1}$ $134_1$ is input to a first zip leg delay buffer $131_2$ of the next zip leg $110_2$ which generates zip leg "off" signal $OFF_{z\_2}$ $132_1$. Zip leg "off" signal $OFF_{z\_2}$ $132_2$ is input to a second zip leg delay buffer $133_2$, which generates zip leg "on" signal $ON_{z\_2}$ $134_2$. The number of delay buffers and pattern of connection of the delay buffers are repeated until n zip leg "off" signals $OFF_{z\_1}$ $132_1$, $OFF_{z\_2}$ $132_2$, ..., $OFF_{z\_n}$ $132_n$, and n zip leg "on" signals $ON_{z\_1}$ $134_1$, $ON_{z\_2}$ $134_2$, ..., $ON_{z\_n}$ $134_n$ are generated.

Zip leg "on" signal $ON_{z\_n}$ $134_n$ is input to a second drive leg delay buffer $137_1$ of the first drive leg $120_1$, which generates drive leg "on" signal $ON_{D\_1}$ $138_1$. Drive leg "on" signal $ON_{D\_1}$ $138_1$ is input to a second drive leg delay buffer $137_2$ of the next drive leg $120_2$, which generates drive leg "on" signal $ON_{D\_2}$ $138_2$. The number of second delay buffers and pattern of connection of the second delay buffers of the drive legs are repeated until m drive leg "on" signals $ON_{D\_1}$ $138_1$, $ON_{D\_2}$ $138_2$, ..., $ON_{D\_m}$ $138_m$ are generated.

Operation of the output driver 100 of FIGS. 2–5 will now be described. The output driver 100 operates in two different modes: tristate mode and drive mode.

In tristate mode, the tristate signal TRISTATE 108 is asserted (corresponding to a high voltage value, or a logic "1"). Thus, (1) signal ntri 147 is at logic level "0", which disables all of the pull-down circuits $114_1$, $114_2$, ..., $114_n$ of the zip legs $110_1$, $110_2$, ..., $110_n$ and pull-down circuits $124_1$, $124_2$, ..., $124_m$, of the drive legs $120_1$, $120_2$, ..., $122_m$, and (2) signal tri 149 is at logic level "1", which disables all of the pull-up circuits $112_1$, $112_2$, ..., $112_n$ of the zip legs $110_1$, $110_2$, ..., $110_n$ and pull-up circuits $122_1$, $122_2$, ..., $122_m$, of the drive legs $120_1$, $120_2$, ..., $120_m$. Accordingly, the output driver 100 is isolated from the output node 102.

In tristate mode, the tristate signal TRISTATE 108 is asserted (i.e., is driven to a logic "1" value); thus, signal ntri 147 is at logic level "0". Multiplexer 140 therefore selects the inverted version 145 of the pad in signal PAD_IN 106 to output as the control signal CTL 141. The signal PAD_IN 106 is the signal from the output node 102 as received by the receiver circuit (see 5 in FIG. 1), which may be implemented using any of a plurality of receiver circuits that are well-known in the art (and not considered a part of the invention). Receiver circuits are well-known in the art, and any Control signal CTL 141 propagates through the first drive leg delay buffers $135_2$, ..., $135_m$, the first and second zip leg delay buffers $131_1$, $133_1$, $131_2$, $133_2$, ..., $131_n$, $133_n$, and second drive leg delay buffers $137_1$, $137_2$, ..., $137_m$ to effectively "preset" all of the pull-up circuits $112_1$, $112_2$, ..., $112_n$ and pull-down circuits $114_1$, $114_2$, ..., $114_m$ of the zip legs $110_1$, $110_2$, ..., $110_n$ and all of the pull-up circuits $122_1$, $122_2$, ..., $122_m$ and pull-down circuits $124_1$, $124_2$, ..., $124_m$ of the drive legs $120_1$, $120_2$, ..., $120_m$ to pull the output node 102 to the drive state that reflects the current signal state of the bus when the tristate signal TRISTATE 108 is deasserted.

To change the mode of the output driver 100 from tristate mode to drive mode, the tristate signal TRISTATE 108 is deasserted (corresponding to a low voltage value, or a logic "0"); thus, signal ntri 147 changes to a logic level "1" and signal tri 149 changes to a logic "0" level. There are generally four possibilities of operation of the driver circuit 100 when coming out of tristate mode into drive mode, depending on the current state of the signal present on the node 102 and the state of the data signal DATA_OUT 104 to be driven onto the node 102.

In the first instance of operation of the driver circuit 100 when coming out of tristate mode into drive mode, the node 102 is at a low voltage level, corresponding to a current state of logic "0" on the node 102, and the data signal DATA_OUT 104 to be driven onto the node 102 is a logic "0". In this instance, the pad in signal PAD_IN 106 (which corresponds to the current state of the signal present on the node 102) is also at a low voltage level, or logic "0". Thus, the inverted pad in signal 145 is at a high voltage level, or logic "1", which is output as control signal CTL $141$ by multiplexer $140$. Control signal CTL $141$ propagates through the first drive leg delay buffers $135_2, \ldots, 135_m$, the first and second zip leg delay buffers $131_1, 133_1, 131_2, 133_2, \ldots, 131_n, 133_n$, and second drive leg delay buffers $137_1, 137_2, \ldots, 137_m$ to effectively "preset" or "ready" all of the pull-down circuits $114_1, 114_2, \ldots, 114_m$ of the zip legs $110_1, 110_2, \ldots, 110_n$ and all of the pull-down circuits $124_1, 124_2, \ldots, 124_m$ of the drive legs $120_1, 120_2, \ldots, 120_m$ to pull the output node $102$ to the logic "0" drive state upon deassertion of the tristate signal TRISTATE $108$. Accordingly, in this instance where the state of the node $102$ is logic "0" and the data signal DATA_OUT $104$ drives a logic "0" when the output driver $100$ comes out of tristate mode and into drive mode, all of the drive legs $120_1, 120_2, \ldots, 120_m$ and all of the zip legs $110_1, 110_2, \ldots, 110_n$ immediately pull the output node $102$ to a logic "0" when the tristate signal TRISTATE is deasserted.

In the second instance of operation of the driver circuit $100$ when coming out of tristate mode into drive mode, the node $102$ is at a low voltage level, corresponding to a current state of logic "0" on the node $102$, and the data signal DATA_OUT $104$ to be driven onto the node $102$ is a logic "1". In this instance, the pad in signal PAD_IN $106$ (which corresponds to the current state of the signal present on the node $102$) is also at a low voltage level, or logic "0". Thus, the inverted pad in signal $145$ is at a high voltage level, or logic "1", which is output as control signal CTL $141$ by multiplexer $140$. Control signal CTL $141$ propagates through the first drive leg delay buffers $135_2, \ldots, 135_m$, the first and second zip leg delay buffers $131_1, 133_1, 131_2, 133_2, \ldots, 131_n, 133_n$, and second drive leg delay buffers $137_1, 137_2, \ldots, 137_m$ to effectively "preset" or "ready" all of the pull-down circuits $114_1, 114_2, \ldots, 114_m$ of the zip legs $110_1, 110_2, \ldots, 110_n$ and all of the pull-down circuits $124_1, 124_2, \ldots, 124_m$ of the drive legs $120_1, 120_2, \ldots, 120_m$ to immediately pull the output node $102$ to the logic "0" drive state upon deassertion of the tristate signal TRISTATE $108$. In this instance, however, since the data signal DATA_OUT $104$ is at a logic "1" and the current state of the signal present on the node $102$ is a logic "0" (as indicated by PAD_IN $106$), the node $102$ must be driven to the opposite state. Thus, when the tristate signal TRISTATE $108$ is deasserted, the multiplexer $140$ selects the inverted DATA_OUT signal $143$ (logic "0") to output as the control signal CTL $141$. The control signal CTL $141$ propagates through the first drive leg delay buffers $135_2, \ldots, 135_m$, to sequentially turn off the pull-down circuits $124_1, 124_2, \ldots, 124_m$ of the drive legs $120_1, 120_2, \ldots, 120_m$, then propagates, in sequence, through each of the first and second delay buffers $131_1, 133_1, 131_2, 133_2, \ldots, 131_n, 133_n$, of the zip legs $110_1, 110_2, \ldots, 110_n$ to first turn off the corresponding pull-down circuit $114_1, 114_2, \ldots, 114_m$ of the corresponding zip leg $110_1, 110_2, \ldots, 110_n$ and then to turn on the corresponding pull-up circuit $112_1, 112_2, \ldots, 112_m$ of the corresponding zip leg $110_1, 110_2, \ldots, 110_n$, and then propagates through the second delay buffers $137_1, 137_2, \ldots, 137_m$ to sequentially turn on the pull-up circuits $122_1, 122_2, \ldots, 122_m$ of the drive legs $120_1, 120_2, \ldots, 120_m$ to pull the output node $102$ to the logic "1" drive state in a slow controlled manner.

In the third instance of operation of the driver circuit $100$ when coming out of tristate mode into drive mode, the node $102$ is at a high voltage level, corresponding to a current state of logic "1" on the node $102$, and the data signal DATA_OUT $104$ to be driven onto the node $102$ is a logic "1". In this instance, the pad in signal PAD_IN $106$ (which corresponds to the current state of the signal present on the node $102$) is also at a high voltage level, or logic "1". Thus, the inverted pad in signal $145$ is at a low voltage level, or logic "0", which is output as control signal CTL $141$ by multiplexer $140$. Control signal CTL $141$ propagates through the first drive leg delay buffers $135_2, \ldots, 135_m$, the first and second zip leg delay buffers $131_1, 133_1, 131_2, 133_2, \ldots, 131_n, 133_n$, and second drive leg delay buffers $137_1, 137_2, \ldots, 137_m$ to effectively "preset" or "ready" all of the pull-up circuits $112_1, 112_2, \ldots, 112_m$ of the zip legs $110_1, 110_2, \ldots, 110_n$ and all of the pull-up circuits $122_1, 122_2, \ldots, 122_m$ of the drive legs $120_1, 120_2, \ldots, 120_m$ to pull the output node $102$ to the logic "1" drive state upon deassertion of the tristate signal TRISTATE $108$. Accordingly, in this instance where the state of the node $102$ is logic "1" and the data signal DATA_OUT $104$ drives a logic "1" when the output driver $100$ comes out of tristate mode and into drive mode, all of the drive legs $120_1, 120_2, \ldots, 120_m$ and all of the zip legs $110_1, 110_2, \ldots, 110_n$ immediately pull the output node $102$ to a logic "1" when the tristate signal TRISTATE is deasserted.

In the fourth instance of operation of the driver circuit $100$ when coming out of tristate mode into drive mode, the node $102$ is at a high voltage level, corresponding to a current state of logic "1" on the node $102$, and the data signal DATA_OUT $104$ to be driven onto the node $102$ is a logic "0". In this instance, the pad in signal PAD_IN $106$ (which corresponds to the current state of the signal present on the node $102$) is also at a high voltage level, or logic "1". Thus, the inverted pad in signal $145$ is at a low voltage level, or logic "0", which is output as control signal CTL $141$ by multiplexer $140$. Control signal CTL $141$ propagates through the first drive leg delay buffers $135_2, \ldots, 135_m$, the first and second zip leg delay buffers $131_1, 133_1, 131_2, 133_2, \ldots, 131_n, 133_n$, and second drive leg delay buffers $137_1, 137_2, \ldots, 137_m$ to effectively "preset" or "ready" all of the pull-up circuits $112_1, 112_2, \ldots, 112_m$ of the zip legs $110_1, 110_2, \ldots, 110_n$ and all of the pull-up circuits $122_1, 122_2, \ldots, 122_m$ of the drive legs $120_1, 120_2, \ldots, 120_m$ to pull the output node $102$ to the logic "1" drive state upon deassertion of the tristate signal TRISTATE $108$. In this instance, however, since the data signal DATA_OUT $104$ is at a logic "0" and the current state of the signal present on the node $102$ is a logic "1" (as indicated by PAD_IN $106$), the node $102$ must be driven to the opposite state. Thus, when the tristate signal TRISTATE $108$ is deasserted, the multiplexer $140$ selects the inverted DATA_OUT signal $143$ (logic "1" to output as the control signal CTL $141$. The control signal CTL $141$ propagates through the first delay buffers $135_2, \ldots, 135_m$ of the drive legs to sequentially turn off the pull-up circuits $122_1, 122_2, \ldots, 122_m$ of the drive legs $120_1, 120_2, \ldots, 120_m$, then propagates, in sequence, through each of the first and second delay buffers $131_1, 133_1, 131_2, 133_2, \ldots, 131_n, 133_n$, of the zip legs $110_1, 110_2, \ldots, 110_n$ to first turn off the corresponding pull-up circuit $112_1, 112_2, \ldots, 112_m$ of the corresponding zip leg $110_1, 110_2, \ldots, 110_n$ and then to turn on the corresponding pull-down circuit $114_1, 114_2, \ldots, 114_m$ of the corresponding zip leg $110_1, 110_2, \ldots, 110_n$, and then propagates through the second delay buffers $137_1, 137_2, \ldots, 137_m$ to sequentially turn on the pull-down circuits $124_1, 124_2, \ldots, 124_m$ of the drive legs $120_1, 120_2, \ldots, 120_m$ to pull the output node $102$ to the logic "0" drive state in a slow controlled manner.

Generally, once the output driver $100$ has come out of tristate mode according to one of the possible instances described above, it operates according to a "normal" drive mode. In "normal" drive mode, when the data signal DATA_OUT $104$ changes from one state to another, the drive legs $110_1, 110_2, \ldots, 110_m$ are first disabled in sequence to isolate the drive legs $110_1, 110_2, \ldots, 110_m$ from driving the output node 102. The zip legs $110_1, 110_2, \ldots, 110_n$ are then enabled in sequence to drive the output node 102 to the state indicated by the data signal DATA_OUT 104. Each zip leg $110_1, 110_2, \ldots, 110_n$ adds more combined drive current pulling the output node 102 to the state indicated by the data signal DATA_OUT 104, which increases or decreases the voltage on output node 102, depending on the direction of the signal transition. When all zip legs $110_1, 110_2, \ldots, 110_n$ have been enabled, the drive legs $110_1, 110_2, \ldots, 110_m$ are then sequentially enabled to supplement the drive current of the zip legs to provide the full required drive current of the output driver 100.

The enabling and disabling of the pull-up circuit $112_i$ and pull-down circuit $114_i$ of a given zip leg $110_1$ depends on the states of the "off" and "on" signals $OFF_{z\_i}$ and $ON_{z\_i}$, respectively. In the preferred embodiment, when the TRISTATE signal 108 is deasserted, these signals are merely inverted delayed versions of the data signal DATA_OUT 104. Thus, in steady state (that is, when data signal DATA_OUT 104 is not transitioning and has completely propagated through all zip legs $110_1, 110_2, \ldots, 110_n$ and all drive legs $120_1, 120_2, \ldots, 120_m$ of the output driver 100), all of the pull-up circuits or the pull-down circuits of all zip legs $110_1, 110_2, \ldots, 110_n$ are turned on to actively electrically connect the output node 102 to one of the first voltage source or second voltage source, and all of the other of the pull-up circuits or the pull-down circuits of all zip legs $110_1, 110_2, \ldots, 110_n$ are turned off to electrically isolate the output node 102 from the other of the first voltage source and second voltage source. Thus, if in steady state the output node 102 is in a high state (represented by pulling the output node 102 to $V_{DD}$), the data signal DATA_OUT 104 is high, and the pull-up circuits of all zip legs $110_1, 110_2, \ldots, 110_n$ are turned on to actively pull the output node 102 to the high voltage source (e.g., $V_{DD}$), and the pull-down circuits of all zip legs $110_1, 110_2, \ldots, 110_n$ are turned off to isolate the output node 102 from the low voltage source (e.g., $V_{SS}$ or ground). Conversely, if in steady state the output node 102 is in a low state (represented by pulling the output node 102 to $V_{SS}$ or ground), the data signal DATA_OUT 104 is low, and the pull-down circuits of all zip legs $110_1, 110_2, \ldots, 110_n$ are turned on to actively pull the output node 102 to the low voltage source (e.g., $V_{SS}$), and the pull-up circuits of all zip legs $110_1, 110_2, \ldots, 110_n$ are turned off to isolate the output node 102 from the high voltage source (e.g., $V_{DD}$). In some applications, the zip legs $110_1, 110_2, \ldots, 110_n$ comprise entirely CMOS components so that during steady state, the output driver 100 draws no current (other than that drawn by transistor leakage). In other applications, the zip legs $110_1, 110_2, \ldots, 110_n$ may also include respective resistors in series with each of the drive FETs (as shown in FIGS. 2 and 3) in order to improve the linearity of the I/V (current to voltage) curve of the output driver.

The zip legs $110_1, 110_2, \ldots, 110_n$ are so named due to their behavior during transitions of the data signal DATA_OUT 104 when the output driver 100 is in drive mode or coming out of tristate mode. As described above, when the data signal DATA_OUT 104 transitions from one drive state to the other, when a zip leg is activated during its sequential turn (as determined by the states of the zip drive signals $OFF_{z\_i}$ $132_i$ and $ON_{z\_i}$ $134_i$ during drive mode), any currently enabled pull-up circuit or pull-down circuit is first turned off (disabled), and then a delay time later, the opposite one of the pull-up circuit or pull-down circuit is turned on (enabled). When the zip legs $110_1, 110_2, \ldots, 110_n$ are arranged sequentially, as in the present invention, to receive a sequentially delayed inverted version of the data signal DATA_OUT 104, as the zip drive signals $OFF_{z\_i}$ $132_i$ and $ON_{z\_i}$ $134_i$, the zip legs $110_1, 110_2, \ldots, 110_n$, or zipper portion of the output driver 100, effectively operate as a "zipper". In this regard, the zipper portion of the output driver 100 operates to one-by-one, first turn off the currently active portion of the zip leg and then, a delay time later, turn on the opposite portion of the zip leg, such that each zip leg $110_1, 110_2, \ldots, 110_n$ is configured to increase the combined impedance pulling the output node 102 to the previous state, and to decrease the combined impedance pulling the output node 102 to the new state represented by the state of the data signal DATA_OUT 104. Thus, the zipper portion of the output driver 100 operates as a stepped voltage divider which controls the slew rate of the output signal seen on the output node 102.

When sizing the drive FETs of the zip legs $110_1, 110_2, \ldots, 110_n$, the designer must determine the slope and shape of the desired signal transitions and make the required engineering tradeoff to meet those needs. If the zip leg drive FETs are too weak (i.e., sized too small), then the voltage on the output node 102 will not be able to charge/discharge the output node 102 fast enough to achieve the desired slope. On the other hand, if the zip leg drive FETs are too strong (i.e., sized too large), then the voltage on the output node 102 will be able to charge/discharge the output node 102 fast enough to achieve the desired slope, but will result in excessive current from $V_{DD}$ to $V_{SS}$ (or ground) through the zip legs during the transition. Accordingly, the designer of the output driver preferably sizes the zip legs so that they are just large enough to charge/discharge the load capacitance in the time needed for the desired slope, yet small enough to limit the current transients during output signal transitions.

Depending on the needs of the application, the output driver 100 may or may not include a staged turn-off and/or turn-on of pull-up circuits and pull-down circuits of the drive legs $120_1, 120_2, \ldots, 120_m$. For example, if the output driver 100 is driving a purely capacitive load (CMOS bus), the staged turn-off and/or turn-on of the drive legs $120_1, 120_2, \ldots, 120_m$ may be unnecessary. On the other hand, if the output driver 100 is driving a resistive load (e.g. a terminated bus), to avoid voltage spikes and/or signal reflections, the staged turn-off and/or turn-on of the drive legs $120_1, 120_2, \ldots, 120_m$ may be advantageous.

The components required for the staged turn-off of the drive legs $120_1, 120_2, \ldots, 120_m$ include the drive leg first delay elements $135_2, \ldots, 135_m$. The components required for the staged turn-on of the drive legs $120_1, 120_2, \ldots, 120_m$ include the drive leg second delay elements $137_2, \ldots, 137_m$. Thus, if no (or little) benefit is derived from such a staged turn-off and/or turn-on of the drive legs $120_1, 120_2, \ldots, 120_m$, the drive leg first delay elements $135_2, \ldots, 135_m$ and drive leg second delay elements $137_2, \ldots, 137_m$ need not be implemented, in which case all drive legs $120_1, 120_2, \ldots, 120_m$ will then be turned off and/or on (nearly) simultaneously.

It will be noted from the description of the preferred embodiment of the output driver that typically, the delay between turn-off and turn-on of the drive FETs in each of the zip legs $110_1, 110_2, \ldots, 110_n$ will be non-zero (i.e., the delay of the second zip leg delay buffer $133_1, 133_2, \ldots, 133_n$ is non-zero), in which case the number of controlled-voltage steps k in the transition of the signal OUT of the output driver will be twice the number of zip legs $110_1, 110_2, \ldots, 110_n$ (i.e., k=2n). However, it will also be appreciated that in some designs, it may be advantageous to reduce the delay between turn-off and turn-on of the drive FETs in each of the zip legs $110_1, 110_2, \ldots, 110_n$ to zero (i.e., the delay of the second zip leg delay buffer $133_1, 133_2, \ldots, 133_n$ is reduced to zero). In this case, the number of controlled-voltage steps k in the transition of the signal OUT will equal the number of zip legs $110_1, 110_2, \ldots, 110_n$ n (i.e., k=n).

The slew rate and shape of the signal OUT driven onto the output node 102 is determined by a number of design factors, including the number of zip legs (corresponding to the number of controlled-voltage steps k in the transition of the signal OUT), the amount of impedance and corresponding amount of drive current of each zip leg increased or decreased at each step k, and the amount of delay $\Delta T_k$ between each step k, and the frequency of the signal OUT on output node 102.

Upon selection of the number of steps k, delay $\Delta T_k$ between each step k, and signal transition edge shape chosen, the desired output voltage values $V_{OUT}$ and pullup and pulldown impedance provided at each step may then be determined for each step k. Those skilled in the art will appreciate that more control over the signal shape, and smoother transitions between steps, is achieved by increasing the number of zip legs, and therefore steps k.

Design Example

As an illustrative example, suppose that the designer desires to achieve a substantially linear slew rate of the output signal OUT. In this example (which includes analysis for only the zip leg portion of the output driver), the following assumptions are made:

1) All zip leg resistances are the same with R given as the resistance of an individual leg;
2) All zip delay buffers have identical delays (this will give a very linear transition);
3) There are n pullup legs and n pulldown legs; and
4) There are 2n voltage steps and 2n+1 voltage levels for 0-to-1 or 1-to-0 transition.

Rising Transition $R_{UP}$ is the pullup resistance at the $k^{th}$ step and $R_{DN}$ is the pulldown resistance at the $k^{th}$ step. The resistance is given as $R_{UP}=R/\text{LEGS}_{UP}$ and $R_{DN}=R/\text{LEGS}_{DN}$, where $\text{LEGS}_{UP}$ is the number of zip pullup legs active at the $k^{th}$ step and $\text{LEGS}_{DN}$ is the number of zip pulldown legs active at the $k^{th}$ step.

$$LEGS_{UP} = \frac{k - \text{mod}2(k)}{2}, \text{ and } LEGS_{DN} = \frac{2n - k - \text{mod}2(k)}{2}, \text{ and}$$

$$R_{UP} = \frac{2R}{k - \text{mod}2(k)}, \text{ and } R_{DN} = \frac{2R}{2n - k - \text{mod}2(k)},$$

where mod2(k) is the remainder of k/2 (=0 for k even and =1 for k odd) (this allows the equations for both odd k and even k to be written in a single closed-form equation).

The total resistance is then:

$$R_{TOT} = R_{UP} + R_{DN} = \frac{4R(n - \text{mod}2(k))}{(k - \text{mod}2(k))(2n - k - \text{mod}2(k))}$$

Using the voltage divider equation, we can solve for the ratio of the output voltage to $V_{DD}$:

$$\frac{V_{OUT}}{V_{DD}} = \frac{R_{DN}}{R_{TOT}} = \frac{k - \text{mod}2(k)}{2(n - \text{mod}2(k))}$$

Failing Transition $R_{UP}$ is the pullup resistance at the $p^{th}$ step and $R_{DN}$ is the pulldown resistance at the $p^{th}$ step. The resistance is given as $R_{UP}=R/\text{LEGS}_{UP}$ and $R_{DN}=R/\text{LEGS}_{DN}$, where $\text{LEGS}_{UP}$ is the number of zip pullup legs active at the $p^{th}$ step and $\text{LEGS}_{DN}$ is the number of zip pulldown legs active at the $p^{th}$ step.

$$LEGS_{UP} = \frac{2n - p - \text{mod}2(p)}{2}, \text{ and } LEGS_{DN} = \frac{p - \text{mod}2(p)}{2}, \text{ and}$$

$$R_{UP} = \frac{2R}{2n - p - \text{mod}2(p)}, \text{ and } R_{DN} = \frac{2R}{p - \text{mod}2(p)},$$

where mod2(p) is the remainder of p/2 (=0 for p even and =1 for p odd).

The total resistance is then:

$$R_{TOT} = \frac{4R(n - \text{mod}2(p))}{(p - \text{mod}2(p))(2n - p - \text{mod}2(p))}$$

Using the voltage divider equation, we can solve for the ratio of the output voltage to $V_{DD}$:

$$\frac{V_{OUT}}{V_{DD}} = \frac{2n - p - \text{mod}2(p)}{2(n - \text{mod}2(p))}$$

TABLE 1 illustrates the calculated values of the ratio of the voltage $V_{OUT}$ of the signal OUT on output node 102 to the supply voltage $V_{DD}$, $\Delta V$, and $2\Delta V$, for k where $V_{OUT}/V_{DD}$ is rising or for p where $V_{OUT}/V_{DD}$ is falling, where the number of zip legs n=5. The columns labeled $\Delta V$ indicate the voltage difference between 2 successive steps. The columns labeled $2\Delta V$ indicate the voltage difference between a step and the 2nd subsequent step (voltage different between an odd step and the next odd step or between an even step and the next even step).

TABLE 1

| | Rising | | | Falling | | |
|---|---|---|---|---|---|---|
| k or p | $V_{OUT}/V_{DD}$ | $\Delta V$ | $2\Delta V$ | $V_{OUT}/V_{DD}$ | $\Delta V$ | $2\Delta V$ |
| 0 | 0.0000 | | | 1.0000 | | |
| 1 | 0.0000 | 0.0000 | | 1.0000 | 0.0000 | |
| 2 | 0.2000 | 0.2000 | 0.2000 | 0.8000 | −0.2000 | −0.2000 |
| 3 | 0.2500 | 0.0500 | 0.2500 | 0.7500 | −0.0500 | −0.2500 |
| 4 | 0.4000 | 0.1500 | 0.2000 | 0.6000 | −0.1500 | −0.2000 |
| 5 | 0.5000 | 0.1000 | 0.2500 | 0.5000 | −0.1000 | −0.2500 |
| 6 | 0.6000 | 0.1000 | 0.2000 | 0.4000 | −0.1000 | −0.2000 |
| 7 | 0.7500 | 0.1500 | 0.2500 | 0.2500 | −0.1500 | −0.2500 |
| 8 | 0.8000 | 0.0500 | 0.2000 | 0.2000 | −0.0500 | −0.2000 |
| 9 | 1.0000 | 0.2000 | 0.2500 | 0.0000 | −0.2000 | −0.2500 |
| 10 | 1.0000 | 0.0000 | 0.2000 | 0.0000 | 0.0000 | −0.2000 |

Figure 6A:
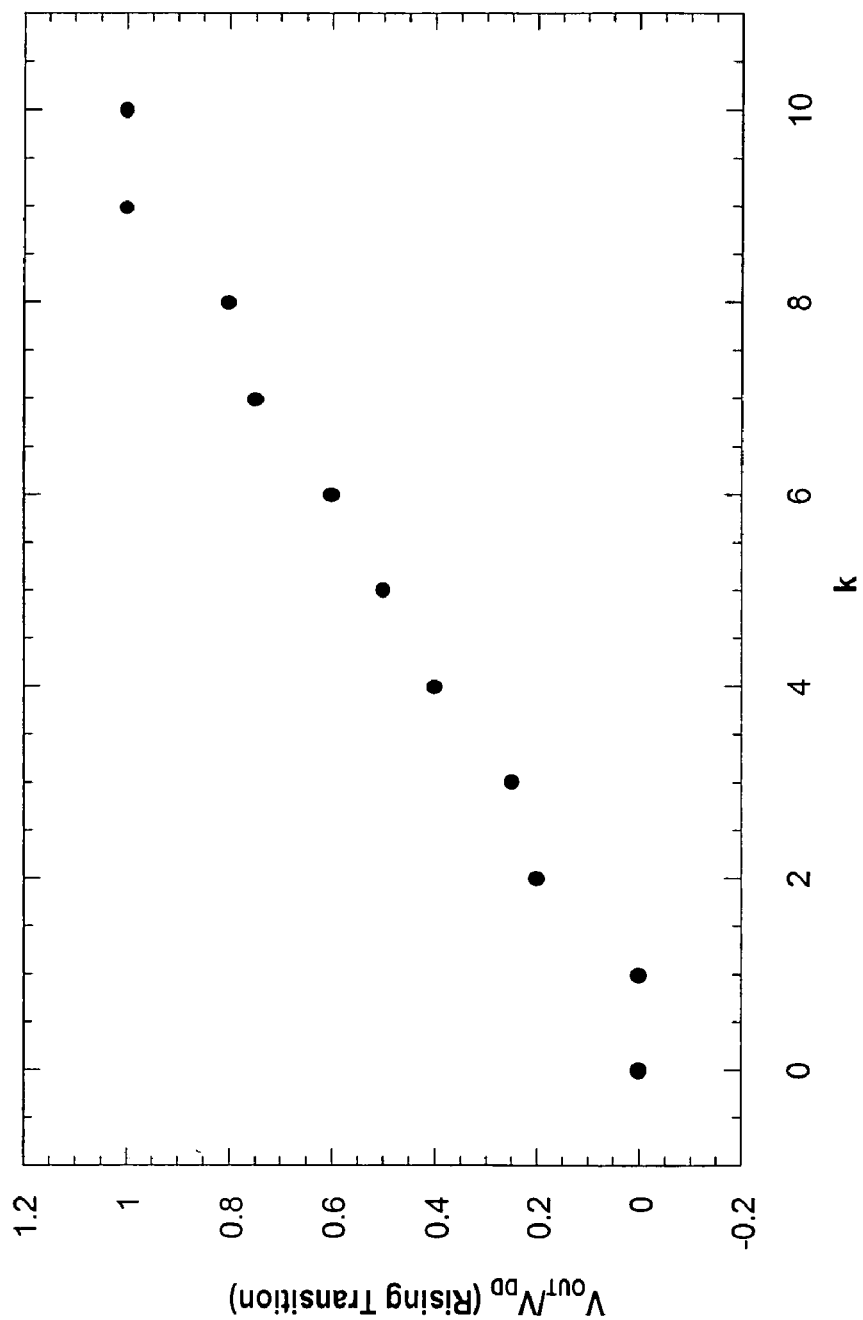
FIG. 6A is a plot of voltage step number versus $V_{out}/V_{DD}$ of an output driver design example implementing 5 zip legs.

FIG. 6A is a plot of voltage step number versus $V_{OUT}/V_{DD}$, illustrating the rising edge of signal OUT on output node 102 based on the calculated values from TABLE 1.

Figure 6B:
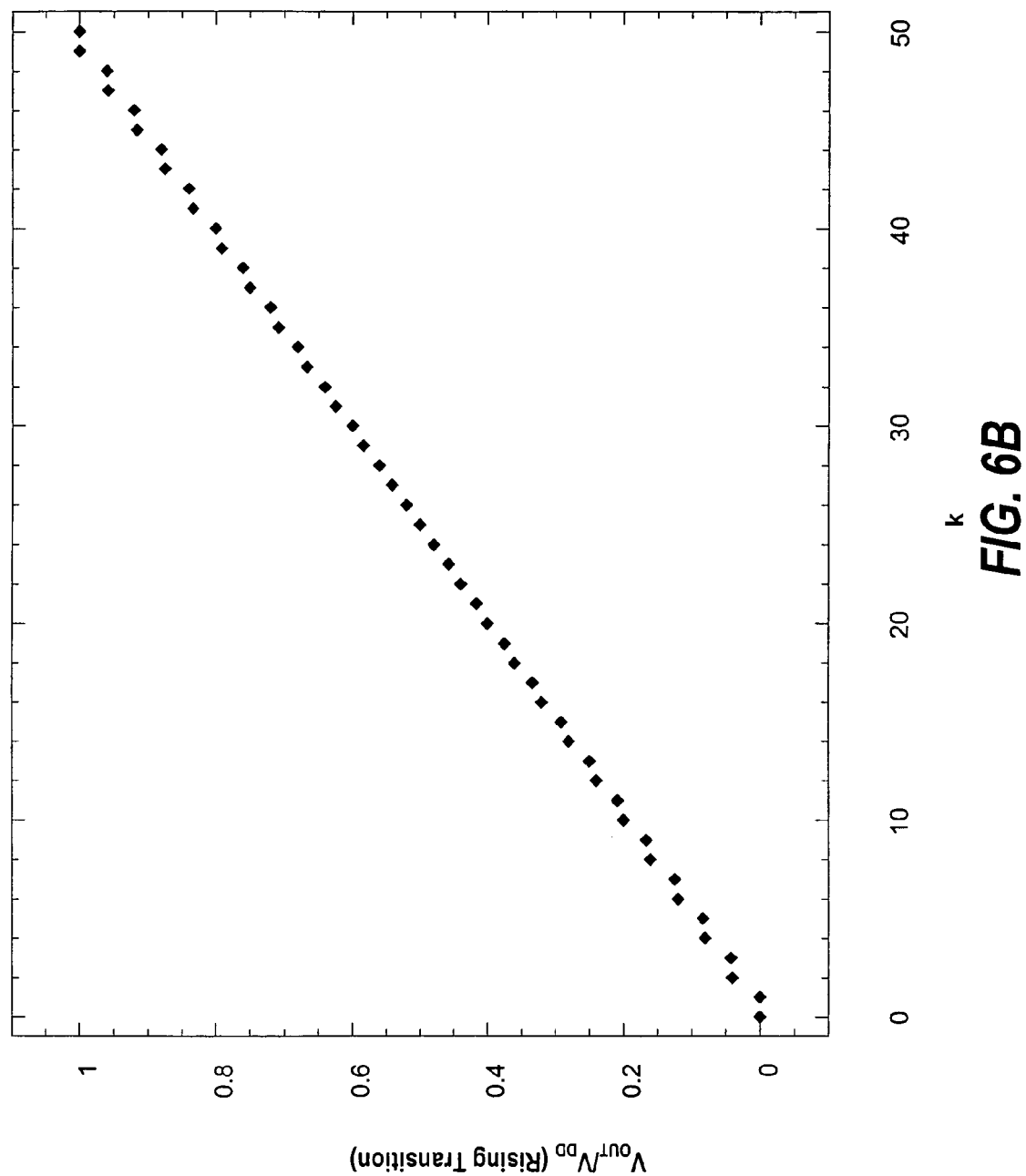
FIG. 6B is a plot of voltage step number versus $V_{out}/V_{DD}$ of an output driver design example implementing 25 zip legs.

TABLE 2 illustrates the calculated values of the ratio of the voltage $V_{OUT}$ of the signal OUT on output node 102 to the supply voltage $V_{DD}$, $\Delta V$, and $2\Delta V$, for k where $V_{OUT}/V_{DD}$ is rising or for p where $V_{OUT}/V_{DD}$ is falling, where the number of zip legs n=25. FIG. 6B is a plot of voltage step number versus $V_{OUT}/V_{DD}$, illustrating the rising edge of signal OUT on output node 102 based on the calculated values from TABLE 2.

TABLE 2

| k or p | Rising $V_{OUT}/V_{DD}$ | $\Delta V$ | $2\Delta V$ | Falling $V_{OUT}/V_{DD}$ | $\Delta V$ | $2\Delta V$ |
|---|---|---|---|---|---|---|
| 0 | 0.0000 | | | 1.0000 | | |
| 1 | 0.0000 | 0.0000 | | 1.0000 | 0.0000 | |
| 2 | 0.0400 | 0.0400 | 0.0400 | 0.9600 | −0.0400 | −0.0400 |
| 3 | 0.0417 | 0.0017 | 0.0417 | 0.9583 | −0.0017 | −0.0417 |
| 4 | 0.0800 | 0.0383 | 0.0400 | 0.9200 | −0.0383 | −0.0400 |
| 5 | 0.0833 | 0.0033 | 0.0417 | 0.9167 | −0.0033 | −0.0417 |
| 6 | 0.1200 | 0.0367 | 0.0400 | 0.8800 | −0.0367 | −0.0400 |
| 7 | 0.1250 | 0.0050 | 0.0417 | 0.8750 | −0.0050 | −0.0417 |
| 8 | 0.1600 | 0.0350 | 0.0400 | 0.8400 | −0.0350 | −0.0400 |
| 9 | 0.1667 | 0.0067 | 0.0417 | 0.8333 | −0.0067 | −0.0417 |
| 10 | 0.2000 | 0.0333 | 0.0400 | 0.8000 | −0.0333 | −0.0400 |
| 11 | 0.2083 | 0.0083 | 0.0417 | 0.7917 | −0.0083 | −0.0417 |
| 12 | 0.2400 | 0.0317 | 0.0400 | 0.7600 | −0.0317 | −0.0400 |
| 13 | 0.2500 | 0.0100 | 0.0417 | 0.7500 | −0.0100 | −0.0417 |
| 14 | 0.2800 | 0.0300 | 0.0400 | 0.7200 | −0.0300 | −0.0400 |
| 15 | 0.2917 | 0.0117 | 0.0417 | 0.7083 | −0.0117 | −0.0417 |
| 16 | 0.3200 | 0.0283 | 0.0400 | 0.6800 | −0.0283 | −0.0400 |
| 17 | 0.3333 | 0.0133 | 0.0417 | 0.6667 | −0.0133 | −0.0417 |
| 18 | 0.3600 | 0.0267 | 0.0400 | 0.6400 | −0.0267 | −0.0400 |
| 19 | 0.3750 | 0.0150 | 0.0417 | 0.6250 | −0.0150 | −0.0417 |
| 20 | 0.4000 | 0.0250 | 0.0400 | 0.6000 | −0.0250 | −0.0400 |
| 21 | 0.4167 | 0.0167 | 0.0417 | 0.5833 | −0.0167 | −0.0417 |
| 22 | 0.4400 | 0.0233 | 0.0400 | 0.5600 | −0.0233 | −0.0400 |
| 23 | 0.4583 | 0.0183 | 0.0417 | 0.5417 | −0.0183 | −0.0417 |
| 24 | 0.4800 | 0.0217 | 0.0400 | 0.5200 | −0.0217 | −0.0400 |
| 25 | 0.5000 | 0.0200 | 0.0417 | 0.5000 | −0.0200 | −0.0417 |
| 26 | 0.5200 | 0.0200 | 0.0400 | 0.4800 | −0.0200 | −0.0400 |
| 27 | 0.5417 | 0.0217 | 0.0417 | 0.4583 | −0.0217 | −0.0417 |
| 28 | 0.5600 | 0.0183 | 0.0400 | 0.4400 | −0.0183 | −0.0400 |
| 29 | 0.5833 | 0.0233 | 0.0417 | 0.4167 | −0.0233 | −0.0417 |
| 30 | 0.6000 | 0.0167 | 0.0400 | 0.4000 | −0.0167 | −0.0400 |
| 31 | 0.6250 | 0.0250 | 0.0417 | 0.3750 | −0.0250 | −0.0417 |
| 32 | 0.6400 | 0.0150 | 0.0400 | 0.3600 | −0.0150 | −0.0400 |
| 33 | 0.6667 | 0.0267 | 0.0417 | 0.3333 | −0.0267 | −0.0417 |
| 34 | 0.6800 | 0.0133 | 0.0400 | 0.3200 | −0.0133 | −0.0400 |
| 35 | 0.7083 | 0.0283 | 0.0417 | 0.2917 | −0.0283 | −0.0417 |
| 36 | 0.7200 | 0.0117 | 0.0400 | 0.2800 | −0.0117 | −0.0400 |
| 37 | 0.7500 | 0.0300 | 0.0417 | 0.2500 | −0.0300 | −0.0417 |
| 38 | 0.7600 | 0.0100 | 0.0400 | 0.2400 | −0.0100 | −0.0400 |
| 39 | 0.7917 | 0.0317 | 0.0417 | 0.2083 | −0.0317 | −0.0417 |
| 40 | 0.8000 | 0.0083 | 0.0400 | 0.2000 | −0.0083 | −0.0400 |
| 41 | 0.8333 | 0.0333 | 0.0417 | 0.1667 | −0.0333 | −0.0417 |
| 42 | 0.8400 | 0.0067 | 0.0400 | 0.1600 | −0.0067 | −0.0400 |
| 43 | 0.8750 | 0.0350 | 0.0417 | 0.1250 | −0.0350 | −0.0417 |
| 44 | 0.8800 | 0.0050 | 0.0400 | 0.1200 | −0.0050 | −0.0400 |
| 45 | 0.9167 | 0.0367 | 0.0417 | 0.0833 | −0.0367 | −0.0417 |
| 46 | 0.9200 | 0.0033 | 0.0400 | 0.0800 | −0.0033 | −0.0400 |
| 47 | 0.9583 | 0.0383 | 0.0417 | 0.0417 | −0.0383 | −0.0417 |
| 48 | 0.9600 | 0.0017 | 0.0400 | 0.0400 | −0.0017 | −0.0400 |
| 49 | 1.0000 | 0.0400 | 0.0417 | 0.0000 | −0.0400 | −0.0417 |
| 50 | 1.0000 | 0.0000 | 0.0400 | 0.0000 | 0.0000 | −0.0400 |

As illustrated in both TABLE 1 and TABLE 2, the $2\Delta V$ columns are bimodal. That is, there are only 2 values for a given value of n. The implication is that if we plot the voltages for only the odd steps or only the even steps, we get a perfectly linear plot. But since the 2 values of $2\Delta V$ are different from each other, the values for $\Delta V$ are constantly changing during the transition. A plot of all of the voltage steps results in a technically non-linear plot; however, it is clear from the plots in both FIGS. 6A and 6B that the overall transition is substantially linear. The voltage steps are the most non-linear at the beginning and end of the transition, and the least non-linear (most linear) at the middle of the transition.

As illustrated from FIGS. 6A (where the number of zip legs n=5) and 6B (where the number of zip legs n=25), the more zip legs used (i.e., the greater n), the smoother the signal transition. Whereas both implementations result in a substantially linear signal OUT, FIG. 6A illustrates that fewer zip legs (n=5) result in "coarse" linear transitions, as compared to FIG. 6B, which illustrates that more zip legs (n=25) result in "fine" linear transitions.

It will be appreciated by those skilled in the art that the shape of the signal OUT driven onto the output node 102 may be controlled by varying the number of steps, the delay amount between each step, and the pullup and pulldown impedance defined for each step.

It will be appreciated that the shape of the edge transitions of the output signal OUT may be precisely controlled by selecting an appropriate number of steps and setting appropriate values for each of the pullup and pulldown impedance and time delay $\Delta T_1, \Delta T_2, \ldots, \Delta T_k$ associated with each step. Thus, if it were desirable to have a non-linear edge transition, the designer could vary the time delay $\Delta T_1, \Delta T_2, \ldots, \Delta T_k$ between each step and/or the pullup or pulldown impedance connected at each step.

It will also be appreciated that the use of a constant time delay $\Delta T$ between each pulldown impedance change step allows one to change the slew rate of the driven signal DATA merely by changing the value of the constant $\Delta T$. By using a variable delay unit whose delay time $\Delta T$ is programmable, the delay buffers $135_2, 135_m, 131_1, 131_2, 131_n, 133_1, 133_2, 133_n, 137_1, 137_2, 137_m$ can be programmed using standard well-known programming methods.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A controlled slew rate output driver which drives an output signal onto a node of a circuit, said output driver comprising:
   a plurality of sequentially ordered zip legs, each comprising:
      a zip pull-up circuit responsive to both a first zip drive signal and a second zip drive signal which switchably electrically connects said node to a first voltage source when both said first zip drive signal and said second zip drive signal are in a first voltage state and electrically isolates said node from said first voltage source when one or both of said first zip drive signal and said second zip drive signal are in a second voltage state, and
      a zip pull-down circuit responsive to both said first zip drive signal and said second zip drive signal which switchably electrically connects said node to said second voltage source when both said first zip drive signal and said second zip drive signal are in said second voltage state and electrically isolates said node from said second voltage source when one or both of said first zip drive signal and said second zip drive signal are in said first voltage state,
   wherein said second zip drive signal of said respective zip leg is a delayed version of said respective first zip drive signal of said corresponding zip leg, and
   wherein said first zip drive signal of said respective zip leg is a delayed version of said second zip drive signal of said zip leg immediately previous to said respective zip leg in said plurality of sequentially ordered zip legs if said previous zip leg exists; and zero or more drive legs, each comprising:

a drive pull-up circuit which switchably electrically connects said node to said first voltage source when each of said respective zip pull-up circuits of all of said zip drive legs are activated to electrically connect said node to said first voltage source and electrically isolates said node from said first voltage source when any of said respective zip pull-up circuits of all of said zip drive legs are deactivated to electrically isolate said node from said first voltage source, and a drive pull-down circuit which switchably electrically connects said node to said second voltage source when each of said respective zip pull-down circuits of all of said zip drive legs are activated to electrically connect said node to said second voltage source and electrically isolates said node from said second voltage source when any of said respective zip pull-down circuits of all of said zip drive legs are deactivated to electrically isolate said node from said second voltage source.

2. An output driver in accordance with claim 1, wherein:

said output driver receives a tristate signal operative in one of an asserted state and a non-asserted state, said asserted state indicating that said output driver is in a tristate mode and said non-asserted state indicating that said output driver is in a drive mode; and each of said respective zip pull-up circuits, said respective zip pull-down circuits, said respective drive pull-up circuits, and said respective drive pull-down circuits are responsive to said tristate signal to electrically isolate said node from said first voltage source and said second voltage source when said tristate signal is in said asserted state.

3. An output driver in accordance with claim 1, wherein:

said zero or more drive legs are sequentially ordered;

when each of said respective zip pull-up circuits of all of said zip drive legs are activated to electrically connect said node to said first voltage source, said output driver performs a delayed activation of said respective drive pull-up circuits of said zero or more drive legs according to said sequential ordering of said zero or more drive legs; and when each of said respective zip pull-down circuits of all of said zip drive legs are activated to electrically connect said node to said second voltage source, said output driver performs a delayed activation of said respective drive pull-down circuits of said zero or more drive legs according to said sequential ordering of said zero or more drive legs.

4. An output driver in accordance with claim 3, wherein:

said output driver receives a drive signal operative in one of a first state and a second state, said first state indicating that said output driver should connect said node to said first voltage source and said second state indicating that said output driver should connect said node to said second voltage source; and when said drive signal transitions from one of said first state and said second state to the other of said first state and said second state, said output driver performs a delayed deactivation of said respective drive pull-up circuits and said respective drive pull-down circuits of said zero or more drive legs according to said sequential ordering of said zero or more drive legs prior to activation of any of said plurality of zip legs.

5. An output driver in accordance with claim 1, wherein:

said zero or more drive legs are sequentially ordered;

said output driver receives a drive signal operative in one of a first state and a second state, said first state indicating that said output driver should connect said node to said first voltage source and said second state indicating that said output driver should connect said node to said second voltage source; and when said drive signal transitions from one of said first state and said second state to the other of said first state and said second state, said output driver performs a delayed deactivation of said respective drive pull-up circuits and said respective drive pull-down circuits of said zero or more drive legs according to said sequential ordering of said zero or more drive legs prior to activation of any of said plurality of zip legs.

6. An output driver in accordance with claim 1, wherein:

each said respective zip pull-up circuit of said plurality of zip legs comprises a logic OR gate and a PFET device, wherein said PFET device comprises a source connected to said first voltage source, a drain connected to said node, and a gate, and wherein said logic OR gate receives as input both said first zip drive signal and said second zip drive signal and generates an OR gate output which drives said gate of said PFET device; and each said respective zip pull-down circuit of said plurality of zip legs comprises a logic AND gate and an NFET device, wherein said NFET device comprises a source connected to said second voltage source, a drain connected to said node, and a gate, and wherein said logic AND gate receives as input both said first zip drive signal and said second zip drive signal and generates an AND gate output which drives said gate of said NFET device.

7. An output driver in accordance with claim 1, wherein:

said output driver receives a drive signal operative in one of a first state and a second state, said first state indicating that said output driver should connect said node to said first voltage source and said second state indicating that said output driver should connect said node to said second voltage source; and each said respective plurality of zip legs comprises a first delay buffer which generates said respective first zip drive signal and a second delay buffer which receives said respective first zip drive signal of said respective zip leg and generates said respective second zip drive signal as a delayed version of said respective first zip drive signal of said respective zip leg; and wherein said respective first delay buffer of said respective zip leg receives said respective second zip drive signal of a respective previous zip leg immediately previous to said respective zip leg in said plurality of sequentially ordered zip legs if said previous zip leg exists, and wherein said respective first delay buffer of said first respective zip leg in said plurality of sequentially ordered zip legs is coupled to received a zip drive signal indicative of said state of said drive signal.

8. An output driver in accordance with claim 1, wherein:

each of said respective zip pull-up circuits, said respective zip pull-down circuits, said respective drive pull-up circuits, and said respective drive pull-down circuits are implemented entirely of CMOS devices.

9. An output driver in accordance with claim 1, wherein:

each of said respective drive pull-up circuits and said respective drive pull-down circuits are implemented to drive a higher current than each of said respective zip pull-up circuits and said respective zip pull-down circuits.

10. An output driver in accordance with claim 1, comprising:
a zip leg controller which generates each of said respective first zip drive signal and said respective second zip drive signal for each of said respective plurality of zip legs.

11. An output driver in accordance with claim 10, wherein:
said zip leg controller programmably adjusts a respective delay between each of said respective first zip drive signal and said respective second zip drive signal for each of said respective plurality of zip legs.

12. A method for controlling the slew rate of an output signal driven onto a node of a circuit by an output driver, said output driver comprising plurality of sequentially ordered zip legs each comprising a zip pull-up circuit responsive to both a first zip drive signal and a second zip drive signal and a zip pull-down circuit responsive to both said first zip drive signal and said second zip drive signal, and zero or more drive legs each comprising a drive pull-up circuit and a drive pull-down circuit, said method comprising:
electrically connecting said node to a first voltage source when both said first zip drive signal and said second zip drive signal are in a first voltage state and electrically isolating said node from said first voltage source when one or both of said first zip drive signal and said second zip drive signal are in a second voltage state;
electrically connecting said node to said second voltage source when both said first zip drive signal and said second zip drive signal are in said second voltage state and electrically isolating said node from said second voltage source when one or both of said first zip drive signal and said second zip drive signal are in said first voltage state; and
electrically connecting said node to said first voltage source when each of said respective zip pull-up circuits of all of said zip drive legs are activated to electrically connect said node to said first voltage source and electrically isolating said node from said first voltage source when any of said respective zip pull-up circuits of all of said zip drive legs are deactivated to electrically isolate said node from said first voltage source; and
electrically connecting said node to said second voltage source when each of said respective zip pull-down circuits of all of said zip drive legs are activated to electrically connect said node to said second voltage source and electrically isolating said node from said second voltage source when any of said respective zip pull-down circuits of all of said zip drive legs are deactivated to electrically isolate said node from said second voltage source.

13. A method in accordance with claim 12, comprising:
receiving a tristate signal operative in one of an asserted state and a non-asserted state, said asserted state indicating that said output driver is in a tristate mode and said non-asserted state indicating that said output driver is in a drive mode; and
electrically isolating said node from said first voltage source and said second voltage source in each of said respective zip pull-up circuits, said respective zip pull-down circuits, said respective drive pull-up circuits, and said respective drive pull-down circuits when said tristate signal is in said asserted state.

14. A method in accordance with claim 12, comprising:
performing a delayed activation of said respective drive pull-up circuits of said zero or more drive legs according to a sequential ordering of said zero or more drive legs when each of said respective zip pull-up circuits of all of said zip drive legs are activated to electrically connect said node to said first voltage source; and
performing a delayed activation of said respective drive pull-down circuits of said zero or more drive legs according to said sequential ordering of said zero or more drive legs when each of said respective zip pull-down circuits of all of said zip drive legs are activated to electrically connect said node to said second voltage source.

15. A method in accordance with claim 12, comprising:
receiving a drive signal operative in one of a first state and a second state, said first state indicating that said output driver should connect said node to said first voltage source and said second state indicating that said output driver should connect said node to said second voltage source;
sequentially delaying a signal representative of said drive signal to sequentially generate each said respective first zip drive signals and said respective second zips drive signals of said plurality of zip legs.

16. A method in accordance with claim 15, comprising:
programmably adjusting a respective delay between each of said respective sequentially delayed first zip drive signals and second zip drive signals.

17. A method in accordance with claim 12, wherein:
each of said respective drive pull-up circuits and said respective drive pull-down circuits are implemented to drive a higher current than each of said respective zip pull-up circuits and said respective zip pull-down circuits.

* * * * *